Figure 1:
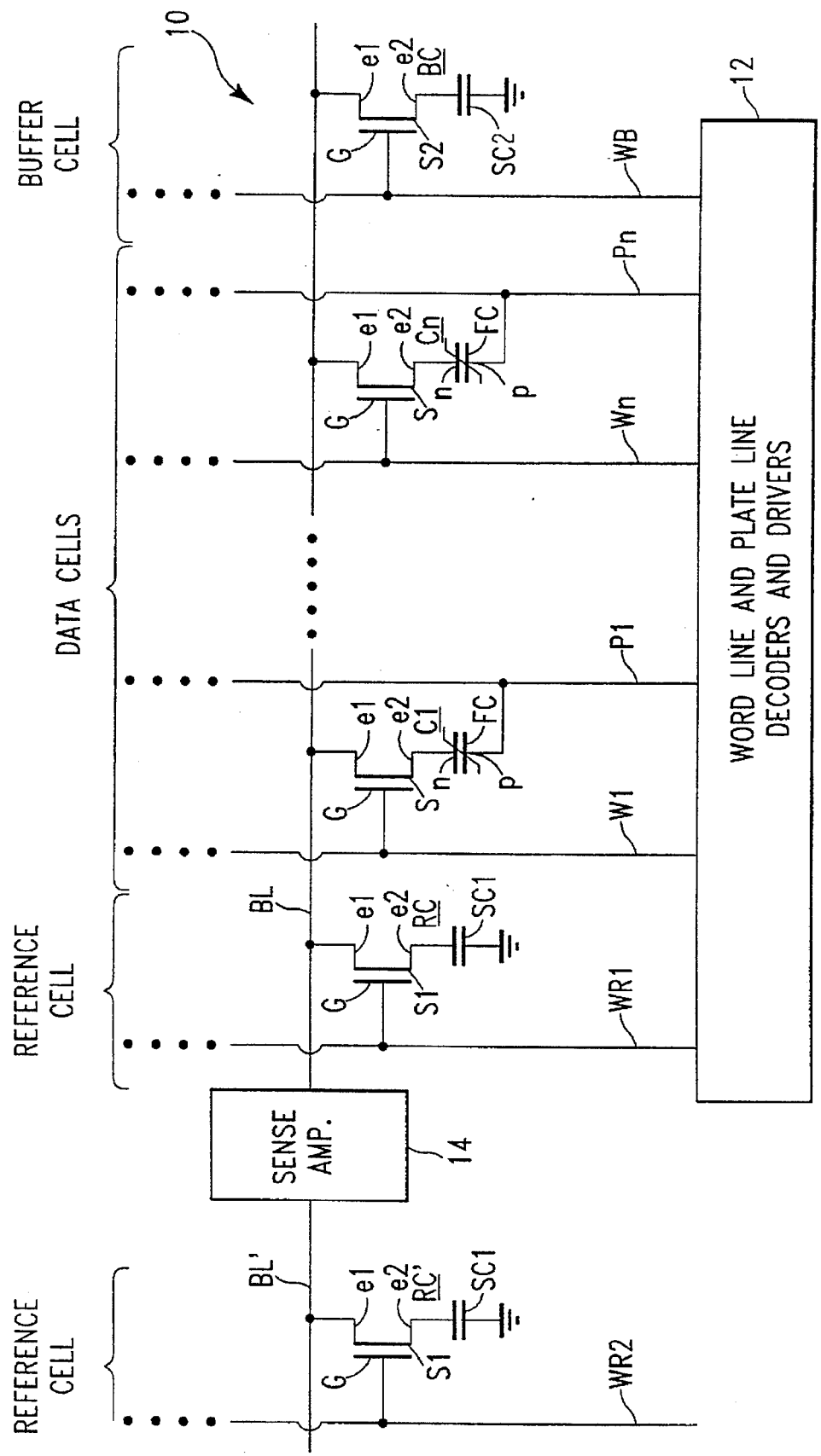

United States Patent [19]
Kenney

[11] Patent Number: 5,640,030
[45] Date of Patent: Jun. 17, 1997

[54] DOUBLE DENSE FERROELECTRIC CAPACITOR CELL MEMORY

[75] Inventor: Donald McAlpine Kenney, Shelburne, Vt.

[73] Assignee: International Business Machines Corporation, Armonk, N.Y.

[21] Appl. No.: 435,679

[22] Filed: May 5, 1995

[51] Int. Cl.$^6$ ............................ H01L 27/108; G11C 11/22
[52] U.S. Cl. .......................... 257/296; 257/295; 257/298; 257/312; 257/532; 257/595; 365/145
[58] Field of Search .......................... 365/145; 257/295, 257/296, 298, 312, 532, 595

[56] References Cited

U.S. PATENT DOCUMENTS

| | | | |
|---|---|---|---|
| 4,055,837 | 10/1977 | Stein et al. | 340/173 R |
| 5,038,323 | 8/1991 | Schwee | 365/145 |
| 5,121,353 | 6/1992 | Natori | 365/145 |
| 5,136,534 | 8/1992 | McDavid et al. | 365/149 |
| 5,163,021 | 11/1992 | Mehrotra et al. | 365/185 |
| 5,250,827 | 10/1993 | Inoue et al. | 365/145 |
| 5,291,436 | 3/1994 | Kamisawa | 365/145 |

OTHER PUBLICATIONS

"A Ferroelectric DRAM Cell for High Density NVRAMS" by R. Moazzami et al, VLSI Symposium, May 1990, pp. 15 and 16.

*Primary Examiner*—Edward Wojciechowicz
*Attorney, Agent, or Firm*—Robert A. Walsh; Stephen J. Limanek

[57] ABSTRACT

A semiconductor memory is provided wherein two bits of binary information are stored simultaneously in a ferroelectric capacitor by utilizing the positive and negative polarization states of the ferroelectric capacitor for storing a first of the two bits of binary information and by utilizing the capacitive characteristic of the ferroelectric capacitor to simultaneously store a second of the two bits of binary information without altering the polarization of the ferroelectric capacitor. When reading information from the ferroelectric capacitor, the second of the two bits of information is read out first and transferred to a buffer cell, then the first of the two bits of binary information is read and re-written, as desired, and the second of the two bits of information is returned from the buffer cell to the ferroelectric capacitor.

20 Claims, 3 Drawing Sheets

DOUBLE DENSE FERROELECTRIC CAPACITOR CELL MEMORY

TECHNICAL FIELD

This invention relates to a random access memory having improved density by storing two bits of binary information in a single ferroelectric capacitor cell.

BACKGROUND ART

The use of ferroelectric capacitors in a one device cell for dynamic random access memory (DRAM) or non-volatile random access memory (NVRAM) applications is well known. These known ferroelectric cells have limited use of two storage mechanisms to store one bit of information per one device cell.

In the article "A Ferroelectric DRAM Cell for High Density NVRAMS", by R. Moazzami et al, VLSI Symposium, May 1990, pp. 15 and 16, there is described a ferroelectric nonvolatile RAM (FNVRAM) which normally operates as a conventional DRAM yet also exploits the hysteresis loop of ferroelectric materials for nonvolatile operation upon command or power failure with the state of the cell being read and written back as one of two permanent polarization states of the ferroelectric film.

In U.S. Pat. No. 4,055,837 by K-U. Stein et al, which issued on Oct. 25, 1977, there is disclosed a single transistor memory including an MNOS capacitor wherein the dielectric has a plurality of selective states and a write line.

In U.S. Pat. No. 5,163,021 by S. Mehrotra et al, which issued on Nov. 10, 1992, there is disclosed an EEPROM cell having a floating gate which stores a plurality of bits by establishing different threshold levels.

U.S. Pat. No. 5,136,534 by J. M. McDavid et al, issued on Aug. 4, 1992, discloses a memory cell having a storage layer which may be a dielectric or a ferroelectric material and thereby used as either a dynamic random access memory cell or a nonvolatile memory cell.

U.S. Pat. No. 5,038.323 by L. J. Schwee, which issued on Aug. 6, 1991, discloses a non-volatile memory cell having a ferroelectric capacitor wherein one electrode of tile capacitor has a fixed voltage of approximately one-half the supply voltage supplied to the memory cell.

U.S. Pat. No. 5,121,353 by K. Natori, which issued on Jun. 9, 1992, discloses a ferroelectric capacitor memory circuit which includes a setting MOS field effect transistor for setting both electrodes of the ferroelectric capacitor at the same potential when the cell is not accessed.

DISCLOSURE OF THE INVENTION

It is an object of this invention to provide a double dense one device cell by operating the switching mechanism of a ferroelectric capacitor at a high voltage for storing a first binary digit of information in the cell and by applying to the capacitor a substantially lower voltage to store simultaneously in the same cell a second binary digit of information.

In accordance with the teachings of this invention, a memory having a double dense one device cell is provided which includes a ferroelectric capacitor wherein a high or power supply voltage Vh is applied across the capacitor to store a first binary digit of information in a non-volatile state utilizing the polarization characteristics of the ferroelectric capacitor and, thereafter, a substantially lower voltage having a magnitude sufficiently low so as not to change the polarity of the non-volatile state is applied across the capacitor to store simultaneously a second binary digit in the same cell in a dynamic state to utilize the capacitance characteristic of the ferroelectric capacitor.

More specifically, the double dense cell of the present invention includes a ferroelectric capacitor having a cell plate and a cell node, a bit line and switching means connected between the cell node and the bit line, means for writing non-volatile data into the ferroelectric capacitor with a given voltage, means for turning off the switching means, means for applying a second voltage having a magnitude approximately one half that of the given voltage to the cell plate and means for applying a voltage to the cell node having a magnitude somewhat greater than or somewhat less than that of the second voltage depending upon data to be stored without destroying the non-volatile data stored in the ferroelectric capacitor.

The foregoing and other objects, features and advantages of the invention will be apparent from the following more particular description of the preferred embodiments of the invention, as illustrated in the accompanying drawings.

BRIEF DESCRIPTION OF THE INVENTION

Figure 2:
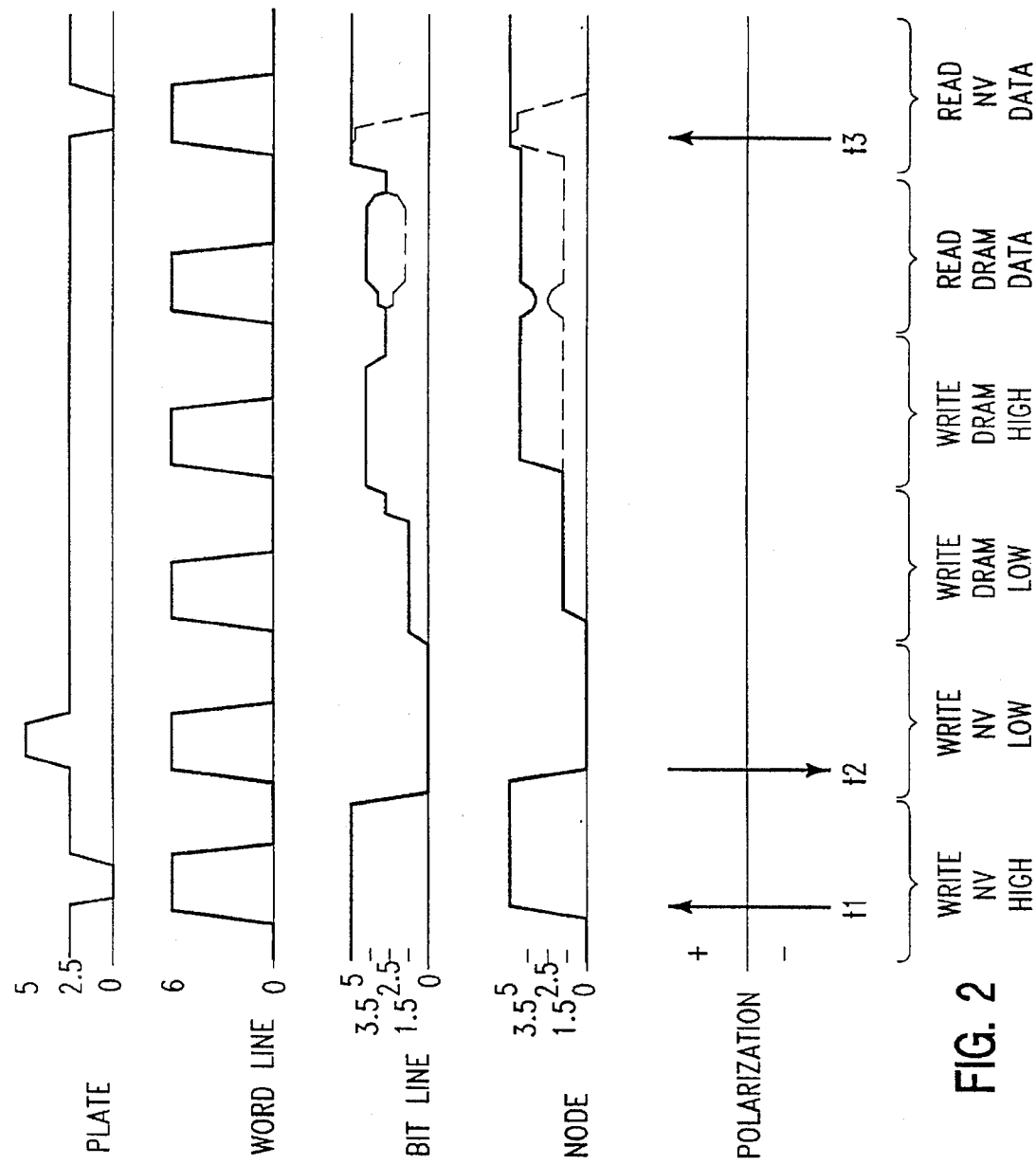
Figure 3:
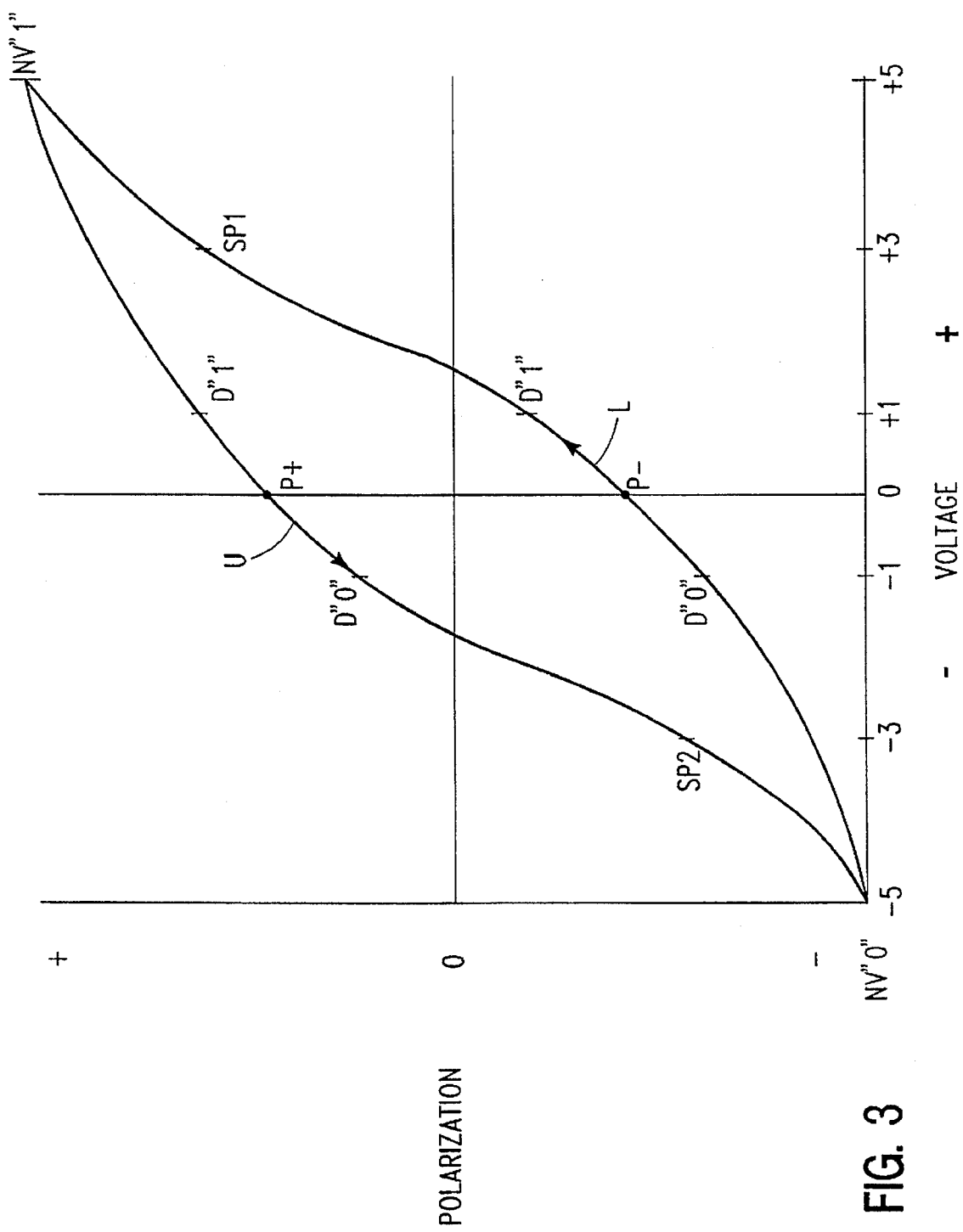

FIG. 1 is a circuit diagram, partly in block form, illustrating a memory having a plurality of the double dense data cells in accordance with the teachings of this invention, FIG. 2 is a pulse program which may be used in the operation of the memory illustrated in FIG. 1 of the drawings, and FIG. 3 is a hysteresis loop associated with a ferroelectric capacitor used in the cells of the memory illustrated in FIG. 1 of the drawings.

BEST MODE FOR CARRYING OUT THE INVENTION

Referring to the drawings in more detail, there is illustrated in FIG. 1 a circuit diagram, partly in block form, of a memory 10 having an array of a plurality of double dense data cells C1 to Cn with each of the cells C1 to Cn having a transfer switch S and a ferroelectric capacitor FC serially connected with the transfer switch S. The transfer switch S is preferably a field effect transistor having a gate electrode G and first and second current carrying electrodes e1 and e2, respectively, and the ferroelectric capacitor is preferably made of lead zirconate titanate, commonly referred to as PZT, having a thickness of about 4,000 angstroms and exhibiting large polarization and hysteresis loops. The ferroelectric capacitor has a cell node n connected to the second current carrying electrode e2 of the transfer switch S and a cell plate p. A word line and plate line decoder and drive circuit 12 includes word lines W1 to Wn and plate lines P1 to Pn with respective word lines W1 to Wn being connected to the gate electrodes G of the transfer switches S of the data cells C1 to Cn and the respective plate lines P1 to Pn being connected to the cell plate p of the ferroelectric capacitor FC of the data cells C1 to Cn. The circuit 12 may include any known decoders and drivers for applying appropriate pulses to the word line and plate lines. A sense amplifier 14 which may be any appropriate known sense amplifier, preferably of the latch type, has a bit line BL connected to the first current carrying electrode e1 of the data cells C1 to Cn. Although not shown, it should be understood that the memory array normally has many additional rows of data cells C1 to Cn connected to other sense amplifiers, such as amplifier 14, through bit lines, such as bit line BL, with the word lines W1 to Wn connected to the gate electrodes and the plate lines P1 to Pn connected to the ferroelectric capacitors of the additional data cells in a manner similar to that shown in the circuit of FIG. 1 of tile drawings.

In addition to the data cells C1 to Cn, there is shown in FIG. 1 a first reference cell RC which includes a transfer switch or transistor S1 having a gate electrode G and first and second current carrying electrodes e1 and e2 and a storage capacitor SC1 connected between the current carrying electrode e2 of the transfer switch S1 and a point of reference potential, such as ground. The electrode e1 is connected to the bit line BL and a word line WR1 connects the gate electrode G of the reference cell RC to the word line and plate line decoder and driver circuit 12. A second reference cell RC' includes a transistor S1 having a gate electrode G, first and second current carrying electrodes e1 and e2 and a storage capacitor SC1 connected between the current carrying electrode e2 of the transistor S1 and a point of reference potential, such as ground. The electrode e1 is connected to a bit line BL' and a word line WR2 connects the gate electrode G of the reference cell RC' to the word line and plate line decoder and driver circuit 12. Preferably, the bit line BL is connected to a first node of the latch of the sense amplifier 14 and the bit line BL' is connected to a second node of the latch of the sense amplifier 14 in a known manner. As is also known, the capacitance of the storage capacitor SC1 of the reference cells is one half of the capacitance of the storage capacitors FC of the data cells. Also, it should be understood that the bit line BL' and the reference cell RC' are used as references when data cells C1 to Cn connected to the bit line BL are being read out and the bit line BL and the reference cell RC are used as references when data cells, not shown, connected to the bit line BL' are being read out. The bit line BL' has connected thereto elements, not shown, similar to the elements connected to the bit line BL shown in FIG. 1. Also shown in FIG. 1 is a buffer cell BC which includes a transfer switch or transistor S2 having a gate electrode G and first and second current carrying electrodes e1 and e2 and a storage capacitor SC2 connected between the current carrying electrode e2 of the transfer switch S2 and a point of reference potential, such as ground. The electrode e1 is connected to the bit line BL and a word line WB connects the gate electrode G of the buffer cell BC to the word line and plate line decoder and driver circuit 12. The storage capacitors SC1 and SC2 may be, e.g., ferroelectric capacitors or silicon dioxide capacitors.

In order to better understand the operation of the multilevel storage memory illustrated in FIG. 1 of the drawings, reference may be had to the pulse program shown in FIG. 2. To write a binary digit of information in, e.g., data cell C1, in a non-volatile state, the word line W1 is selected by the word line and plate line decoder and driver circuit 12 and a power supply voltage Vh plus a threshold voltage Vt, e.g., 5 volts plus 1 volt for a total of 6 volts, is applied thereto from the circuit 12. With 6 volts applied to the word line W1, the transistor S of the cell C1 is turned on and, under the control of the word line and plate line decoder and driver circuit 12, a voltage on the plate line P1 lowers the voltage on the cell plate p to 0 volts while the bit line BL applies 5 volts, which may be derived from the sense amplifier 14, to the cell node n to polarize the ferroelectric capacitor FC of the cell C1 in a positive or + direction, as indicated by the arrow in the pulse program of FIG. 2, WRITE NV HIGH, at polarization at time t1 to represent a binary 1. It should be understood that the voltage on the word line W1 is at 6 volts prior to lowering the voltage on the cell plate n to 0 volts and remains at 6 volts until after the voltage on the cell plate n rises to 2.5 volts.

To write a 0 binary digit of information in cell C1 in a non-volatile state, the word line W1 is selected and 6 volts are applied thereto from circuit 12, as indicated in FIG. 2, WRITE NV LOW, to turn on transistor S1. After the transistor S1 is turned on, a voltage on the plate line P1 raises the voltage on the cell plate p to 5 volts and the bit line BL applies 0 volts, which may be derived from the sense amplifier 14, to the cell node n to polarize the ferroelectric capacitor FC of the cell C1 in a negative or − direction, as indicated by the arrow in the pulse program of FIG. 2 at polarization at time t2. This write procedure is similar to that described in the above cited Moazzami et al article in which the write operation is a two step procedure, first writing NV highs and then NV lows, or vice versa. This two step procedure is limited only to writing NV or non-volatile data, the volatile data being written by conventional DRAM procedures.

With a 0 binary digit of information stored in cell C1 in a non-volatile state, a second binary digit of information, e.g., another 0 bit, may now be stored simultaneously in cell C1 in a volatile or dynamic state as indicated in the graph of FIG. 2, WRITE DRAM LOW, by applying a voltage of 2.5 volts to the cell plate p from plate line P1 and applying a voltage of 1.5 volts to the cell node n from the sense amplifier 14 through the bit line BL and the transistor S. Thus, it can be seen that there is now a −1 volt applied across the ferroelectric capacitor FC, i.e., the cell node n is one volt negative with respect to the voltage on the cell plate p. Alternatively, to write a 1 binary digit of information into the cell c1 with a 0 binary digit of information already stored therein in a non-volatile state, as indicated in the graph of FIG. 2, WRITE DRAM HIGH, the cell plate p remains at 2.5 volts and the bit line voltage is increased to 3.5 volts to apply to the cell node n a voltage of 3.5 volts, as indicated by the solid line, through the transistor S. Thus, it can be seen that there is now +1 volt across the ferroelectric capacitor FC, i.e., the cell node n is one volt positive with respect to the cell plate p. This dynamic storage of a binary 1 or 0 in the same cell that already has a non-volatile bit stored therein is brought about by utilizing the non-ferroelectric capacitive characteristic of the ferroelectric capacitor FC rather than the ferroelectric polarization characteristics of the storage capacitor FC, as described in the above cited Moazzami et al article, and without any significant disturbance of the previously stored non-volatile binary digit. It should be understood that write data pulses applied to the bit line BL may be derived from any known write source but generally are available at the latch of the sense amplifier 14.

To read a binary digit of information which is stored dynamically in cell C1, 2.5 volts are applied, e.g., from the sense amplifier 14 to the bit line BL and the cell plate p is held at 2.5 volts. With the bit line floating at 2.5 volts, the transistor S of the cell C1 is turned on. If a 1 binary digit of information is dynamically stored in the ferroelectric capacitor FC of cell C1, i.e., if the cell node n of the ferroelectric capacitor FC of cell C1 is at 3.5 volts, as indicated by the solid line, the voltage on the bit line BL utilizing stored charge in the ferroelectric capacitor FC will increase toward 3.5 volts, as also indicated by the solid line in the graph of FIG. 2, READ DRAM DATA, and the latch of the sense amplifier 14 will flip so as to sense the storage of a 1 binary digit of information. If, however, a 0 binary digit of information is dynamically stored in the ferroelectric capacitor FC of cell C1, i.e., if the cell node n of the ferroelectric capacitor FC of cell C1 is at 1.5 volts, then the voltage on the bit line BL will decrease toward 1.5 volts, as indicated by the dashed line in the graph of FIG. 2, READ DRAM DATA, and the latch of the sense amplifier 14 will flip in the opposite direction so as to sense the storage of a 0 binary digit of information. After the dynamically stored information is read out of the cell C1, it may be restored in the same manner as described hereinabove in connection with the writing of a 0 or a 1 into cell C1 in a dynamic state.

In order to read a binary digit of information from cell C1 which has been stored in a non-volatile state, the dynamically stored information must be read out first and stored in the buffer cell BC in any conventional or desired manner since the read out of a binary digit of information stored in the cell C1 in a non-volatile state would otherwise destroy the information stored in the cell C1 in the dynamic state. After the dynamically stored information in cell C1 is transferred to the buffer cell BC, the bit line BL and the bit line BL' are set at 5 volts prior to sensing the non-volatile data in cell C1, and the word line WR1 having 5 volts applied thereto turns on transistor S1 of the reference cell RC. Thereafter, the voltage on the word line W1 is raised to 6 volts, as indicated in the graph of FIG. 2, READ NV DATA, and the voltage on the cell plate p is lowered to 0 volts after the voltage on the word line W1 has been raised to 6 volts. If a 0 binary digit of information is stored in cell C1 in the non-volatile state, the polarization in the ferroelectric capacitor FC will switch from the negative or − direction to a positive or + direction, as indicated in the graph of FIG. 2 at time t3. With the voltage at the bit line BL and the cell node n of the cell C1 dropping to 0 volts, as indicated by the dashed lines in FIG. 2, READ NV DATA, since the voltage on the bit line BL falls at a faster rate than does the voltage on the bit line BL', the latch of the sense amplifier 14 will indicate a non-volatile 0 binary digit of information stored in cell C1. On the other hand, if a 1 binary digit of information is stored in a non-volatile state in cell C1, the polarization in the ferroelectric capacitor will not switch direction at time t3. The voltage at the bit line BL and at the cell node n of cell C1 will remain at 5 volts, as indicated by the solid lines in FIG. 2, READ NV DATA, since the voltage on the bit line BL' will fall at a faster rate than will the on the bit line BL, the latch of the sense amplifier 14 thus indicating a non-volatile 1 binary digit of information stored in cell C1. It should be understood that when reading the non-volatile data from data cell C1, the transistor S1 of the reference cell RC' is turned on and that the storage capacitor SC1 of the reference cell RC' has only one half of the capacitance of that of the storage capacitor FC of the data cell C1.

To restore the two binary digits of information in the cell C1, the non-volatile information is stored first in the cell C1 from the sense amplifier 14 and, thereafter, the dynamically stored information in the buffer cell BC is transferred back to the cell C1 after being sensed and set on the bit line BL by the latch 14.

To more clearly understand the operation of the memory of the present invention which is illustrated in FIG. 1 of the drawings, reference may be had to the hysteresis loop, having a lower curve L and an upper curve U, shown in FIG. 3 of the drawings, along with the pulse program shown in FIG. 2. It can be seen from FIG. 3, wherein the ordinate of the graph indicates the polarization of the ferroelectric capacitor as being + or − and the abscissa indicates a + or − voltage or electric field, with the + voltage indicating that the cell node n is at a more positive voltage than the voltage on the cell plate p and with the − voltage indicating that the cell node n is at a more negative or lower voltage than the voltage on the cell plate p.

When a non-volatile 0 binary digit of information is stored in the data cell C1, indicated in the hysteresis loop at NV "0" in FIG. 3, the voltage across the ferroelectric capacitor FC is at −5 volts, i.e., the voltage on the cell node n is at 0 volts and the voltage an the cell plate is at 5 volts, and the polarization of the ferroelectric capacitor FC is negative, as indicated in FIG. 2 at time t2. To store a non-volatile 1 binary digit of information in the data cell C1, indicated at NV "1", +5 volts are applied across the ferroelectric capacitor FC, i.e., a voltage of 5 volts is applied to the cell node n, with 0 volts being applied to the cell plate n, as indicated in FIG. 2 at time t1. As the voltage across the ferroelectric capacitor FC of the data cell C1 changes from −5 volts to +5 volts, the polarization of the ferroelectric capacitor FC changes in a counterclockwise direction from point NV "0" to point NV "1" along the lower curve L of the hysteresis loop of FIG. 3, where it will remain in a relatively stable polarization state after the transistor S of the data cell C1 is turned off. To restore e non-volatile 0 binary digit of information in the ferroelectric capacitor FC of the data cell C1, a voltage of −5 volts is again applied across the ferroelectric capacitor FC which returns the polarization along the upper curve U in the counterclockwise direction to the − value at NV "0", as indicated in FIG. 2 at time t2. Thus, it can be seen that by applying +5 or −5 volts across the ferroelectric capacitor FC, a binary 1 or 0, respectively, is stored in the capacitor FC in a non-volatile state.

After storing a binary digit in the ferroelectric capacitor FC in a non-volatile state with the polarization at either point NV "0" or NV "1" on the hysteresis loop, a second binary digit of information may be stored in the same ferroelectric capacitor FC of the data cell C1 without destroying the stored non-volatile information. Again referring to FIG. 2 and to FIG. 3 of the drawings and assuming that the ferroelectric capacitor FC is storing a non-volatile 0 binary digit with the polarization at NV "0", if the second binary digit to be stored is a 0, the voltage across the ferroelectric capacitor FC of data cell C1 is reduced from −5 volts to −1 volt, i.e., the voltage applied to the cell node n is at 1.5 volts and the voltage applied to the cell plate p is at 2.5 volts, as indicated in FIG. 2 at WRITE DRAM LOW. With the transistor S of the data cell C1 turned off, the voltage on the cell node n will remain at 1.5 volts and cell plate p will be maintained at 2.5 volts to provide −1 volt across the capacitor FC. Thus, the polarization of the ferroelectric capacitor FC will move along the lower curve L of the hysteresis loop of FIG. 3 from point NV "0" to a point D "0". If the second binary digit of information to be stored is a 1 instead of a 0, the voltage across the ferroelectric capacitor FC of data cell C1 is changed from −5 volts to +1 volt, i.e., the voltage applied to the cell node n is at 3.5 volts and the voltage applied to the cell plate p is at 2.5 volts to provide a +1 volt across the capacitor FC. Thus, the polarization of the ferroelectric capacitor FC will move along the lower curve L of the hysteresis loop of FIG. 3 from point NV "0" to a point D "1". The difference in polarization charge per unit area between the D "0" state and the D "1" state is the volatile charge dynamically stored on the cell node n to represent dynamic binary data levels. It can be seen that during read out the sense amplifier 14 can readily distinguish between a dynamically stored 0 binary digit of information at point D "0" on the lower curve L of the hysteresis loop of FIG. 3 and a dynamically stored 1 binary digit at point D "1" on the lower curve L. It should be understood that the second binary digit of information stored at either point D "0" or point D "1", being stored dynamically, needs to be refreshed as is known in the dynamic random access memory DRAM art. The switching point of the ferroelectric in the capacitor should be tailored to be at a value about midway between the one volt dynamic voltage and the 5 volt non-volatile voltage, i.e., at +3 volts and at −3 volts, as indicated in FIG. 3 at SP1 and SP2, respectively. It can be seen that movement along the lower curve L of the hysteresis loop to point D "0" or D "1" from point NV "0" will not switch the non-volatile polarization of the data cell C1 which is storing the non-volatile 0 binary digit.

It should be noted that if the non-volatile binary digit of information stored in the data cell C1 is a 1, the polarization of the ferroelectric cell FC is at or near the point NV "1" on the hysteresis loop of FIG. 3. If the non-volatile or first digit is a 1, then the polarization of the ferroelectric capacitor FC of the data cell C1 moves along the upper curve U of the hysteresis loop of FIG. 3 when a dynamic 1 or 0 binary digit of information is stored as the second digit in cell C1. If a dynamic 1 digit is stored after the non-volatile 1 digit has been entered into the ferroelectric capacitor FC, the polarization of the ferroelectric cell FC moves along the upper curve U from point NV "1" to point D "1", at which point +1 volt is being applied across the ferroelectric capacitor FC, i.e., the voltage applied to the cell node n is 3.5 volts and the voltage applied to the cell plate p is 2.5 volts. If a dynamic 0 digit is stored after the non-volatile 1 digit has been entered into the ferroelectric capacitor FC, the polarization of the ferroelectric capacitor FC moves along the upper curve U of the hysteresis loop from point NV "1" to point D "0", at which point −1 volt is being applied across the ferroelectric capacitor FC, i.e., the voltage applied to the cell node n is at 1.5 volts and the voltage applied to the cell plate is 2.5 volts. Again it should be understood that this dynamically stored information must be refreshed periodically as in known DRAM cells. It can be seen that movement along the upper curve U of the hysteresis loop to point D "1" or D "0" from point NV "1" will not switch the non-volatile polarization of the data cell C1 which is storing the non-volatile 1 binary digit. It should be understood that the reference cell or bit line must be optimally centered for both the upper hysteresis curve U between the D "1" state and the D "0" state and the lower hysteresis curve L between the D "1" state and the D "0" state. Although the dynamically stored information must be refreshed in the data cells so as to not lose this stored information, it can also be seen in FIG. 3 that the non-volatile information will not be lost even if all the voltage is removed from across the ferroelectric capacitor FC since, if a non-volatile 1 digit has been stored the + polarization w111 be indicated at point P+, the remnant polarization, on the upper curve U of the hysteresis loop and if a non-volatile 0 digit has been stored the − polarization will be indicated at point P−, the remnant polarization, on the lower curve L.

Since the dynamically stored information moves along the lower and upper curves of the hysteresis loop of FIG. 3 only between points D "0" and D "1", there will be only a very small amount of disturbance of the negative or positive polarization of the ferroelectric capacitor FC during a dynamic read or write cycle. Known ferroelectric capacitors may endure at least $10^{10}$ cycles before there is any concern of capacitor failure, whereas in other known non-volatile storage elements such as ENOS devices useful life is only about $10^6$ cycles. Furthermore, it should be noted that the write time for MNOS devices is approximately 10 microseconds at 30 volts, as stated in the above cited Stein et al patent, whereas the polarization states in a ferroelectric capacitor can be switched in about 20 nanoseconds at only 5 volts, as stated in the above cited Schwee patent. Thus, the data cell C1 of FIG. 1 of the drawings using a ferroelectric capacitor is about 500 times faster than the write time for a typical ENOS device and operates at only one sixth of the voltage of the ENOS device. As stated hereinabove, the reference cells RC and RC' may have storage capacitors SC1 that are ferroelectric capacitors or volatile silicon dioxide capacitors. However, if a ferroelectric polarization characteristic is used rather than the non-ferroelectric capacitive characteristic, then the fixed voltage reference or ground of the capacitors SC1 and SC2 would be replaced by a plate line similar to that used by the data cells C1 to Cn. If wearout is a concern, since these storage capacitors SC1 are used more frequently than are the data capacitors FC, volatile reference capacitors, such as silicon dioxide capacitors, may be preferred, although the ferroelectric capacitor has a higher dielectric constant than does the silicon dioxide capacitor. Also, the storage capacitor SC2 in the buffer cell BC may, if preferred, be a ferroelectric capacitor or a volatile capacitor, such as a silicon dioxide capacitor. Furthermore, a static memory cell rather than a dynamic memory cell may be used as the buffer cell BC, however, since the switching of the ferroelectric capacitors of the storage cells C1 to Cn is very fast, even in the non-volatile state, there is generally no need to refresh the information stored in the dynamic buffer cell BC illustrated in FIG. 1 before transferring its data back to a given ferroelectric cell after reading and re-writing the non-volatile data of the given ferroelectric cell and, therefore, a dynamic buffer cell PC is preferred.

It should be understood that the data cell Cn shown in FIG. 1 of the drawings is operated in the same manner as is the data cell C1 except that the data cell Cn is selected by applying the appropriate voltages to the word line Wn and the plate line Pn from the word line and plate line decoder and driver circuit 12. Other data cells between data cells C1 and Cn are also operated in the same manner. It should also be understood that other data cells connected to other bit lines, sense amplifiers and buffer cells, not shown, may be accessed simultaneously with the accessing of the data cells C1 to Cn when connected to a common word line W1 to Wn and to a common plate line P1 to Pn.

Although a pulse program illustrated in FIG. 2 and discussed hereinabove has been disclosed, other specific voltage/sequence combinations could also be used for simultaneously storing two binary digits in one ferroelectric capacitor cell. Furthermore, as is known, the hysteresis loop of the ferroelectric capacitors can be optimized by modifying the composition of the ferroelectric film in the capacitor.

Of course, if desired, a positive polarization of the ferroelectric capacitor may be considered to store a non-volatile 0 binary digit and a negative polarization to store a non-volatile 1 binary digit. Also, 3.5 volts applied to the cell node n of the ferroelectric capacitor may be considered to store a volatile 0 binary digit and 1.5 volts to store a volatile 1 binary digit.

It can be seen that in accordance with the teachings of this invention an improved double dense memory has been provided which includes a multi-level one device storage or data cell having a ferroelectric capacitor and a method or pulse program for multi-level storing of two binary digits of information in each of the storage or data cells.

While the invention has been particularly shown and described with reference to preferred embodiments thereof, it should be understood by those skilled in the art that various changes in form and detail may be made therein without departing from the spirit and scope of the invention.

What is claimed is:

1. A semiconductor memory comprising
    a ferroelectric capacitor having first and second polarization states and a volatile storage mechanism, and voltage means for applying a first voltage having a given magnitude to said ferroelectric capacitor to select one of said first and second polarization states to store a 0 or 1 binary digit, respectively, in said ferroelectric capacitor and for subsequently applying a second voltage having a magnitude significantly smaller than said given magnitude to said ferroelectric capacitor to simultaneously store a 0 or 1 binary digit in the volatile storage mechanism of said ferroelectric capacitor.

2. A semiconductor memory as set forth in claim 1 further including a bit line, a plate line and a transfer switch connected serially with said ferroelectric capacitor and disposed between said bit line and said plate line, said means applying said first and second voltages between said bit line and said plate line.

3. A semiconductor memory as set forth in claim 2 wherein said transfer switch is a field effect transistor having a gate electrode and further including a word line connected to the gate electrode and given means for applying a voltage to said word line to turn on said transistor while said first and second voltages are being applied to said bit line and plate line.

4. A semiconductor memory as set forth in claim 1 wherein said voltage means includes a power supply source having a voltage of said given magnitude for providing said first voltage and said second voltage has a magnitude of a small fraction of said given magnitude.

5. A semiconductor memory as set forth in claim 4 wherein said given voltage magnitude is approximately 5 volts and the magnitude of said second voltage is approximately 1 volt.

6. A semiconductor memory as set forth in claim 3 wherein said voltage means applies the first voltage to either said bit line or to said plate line depending upon the 0 or 1 binary digit to be stored in one of the polarization states of said ferroelectric capacitor and a 0 voltage on the other of said lines and applies to said plate line a voltage having a magnitude approximately one half that of the given magnitude to store a 0 or 1 binary digit in the volatile storage mechanism of said ferroelectric capacitor.

7. A semiconductor memory as set forth in claim 6 wherein the magnitude of the first voltage is 5 volts.

8. A semiconductor memory comprising
means including a ferroelectric capacitor having a non-volatile mechanism storing first data therein and a volatile storing mechanism simultaneously storing second data therein,
a bit line,
a plate line,
a transfer switch connected serially with said ferroelectric capacitor between said bit line and said plate line,
reference voltage means,
sensing means having first and second nodes, said bit line and said reference voltage means being connected to the first and second nodes, respectively, of said sensing means,
a buffer cell connected to said bit line, and
means including word line and plate line decoder and driver means coupled to said transfer switch and to said plate line for reading the second data from said ferroelectric capacitor and for storing said second data into said buffer cell and for subsequently reading said second data from said buffer cell and for restoring said second data back into said ferroelectric capacitor without destroying the first data.

9. A semiconductor memory as set forth in claim 8 wherein said transfer switch is a field effect transistor having a gate electrode connected to said word line and plate line decoder and driver means and said buffer cell is a dynamic one device cell.

10. A semiconductor memory comprising
a ferroelectric capacitor including a non-volatile mechanism having first and second states and a volatile storing mechanism,
means for applying a first voltage to said ferroelectric capacitor to set said ferroelectric capacitor in one of said first and second non-volatile states to store a first binary digit of information in said ferroelectric capacitor and for subsequently applying a second voltage having a significantly smaller magnitude than that of said first voltage insufficient to erase the first binary digit to said ferroelectric capacitor to simultaneously store a second binary digit of information in the volatile storing mechanism of said ferroelectric capacitor,
a buffer cell,
means for reading the second binary digit of information stored in said ferroelectric capacitor and for transferring the second binary digit of information to said buffer cell, and means for reading the first binary digit of information stored in said ferroelectric capacitor.

11. A semiconductor memory as set forth in claim 10 wherein said non-volatile mechanism having first and second states includes positive and negative, respectively, polarization of said ferroelectric capacitor and said volatile storing mechanism includes capacitive characteristics of said ferroelectric capacitor.

12. A method of operating a ferroelectric capacitor cell memory for simultaneously storing first and second binary digits of information therein, said memory including a ferroelectric capacitor having a non-volatile mechanism having first and second states and a volatile storing mechanism and a buffer cell, the steps of the method comprising
applying a first voltage to said ferroelectric capacitor to set said ferroelectric capacitor in one of said first and second non-volatile states to store the first binary digit of information in said ferroelectric capacitor,
applying a second voltage having a smaller magnitude than that of the first voltage insufficient to erase the first binary digit to said ferroelectric capacitor after storing said first binary digit to simultaneously store a second binary digit of information in the volatile storing mechanism of said ferroelectric capacitor,
reading the second binary digit of information stored in said ferroelectric capacitor and transferring the second binary digit of information to said buffer cell, and
reading the first binary digit of information stored in said ferroelectric capacitor after storing the second binary digit of information in said buffer cell.

13. A method of operating a ferroelectric capacitor cell memory for simultaneously storing first and second binary digits of information therein, said memory including a ferroelectric capacitor having first and second polarization states and a volatile storage mechanism and a buffer cell, the steps of the method comprising
applying a first voltage to said ferroelectric capacitor to set the ferroelectric capacitor in one of the first and second polarization states to store the first binary digit of information in said ferroelectric capacitor,
applying a second voltage having a significantly smaller magnitude than that of the first voltage insufficient to erase the first binary digit to said ferroelectric capacitor after storing the first binary digit to simultaneously store the second binary digit of information in the volatile storage mechanism of said ferroelectric capacitor, reading the second binary digit of information stored in said ferroelectric capacitor and transferring the second binary digit of information to said buffer cell, and reading the first binary digit of information stored in the ferroelectric capacitor after storing the second binary digit in said buffer cell.

14. A method of operating a ferroelectric capacitor cell memory as set forth in claim 13, said first voltage applying step applying +5 or −5 volts across said ferroelectric capacitor to store the first binary digit of information in said ferroelectric capacitor and said second voltage applying step applying a +1 or −1 volt across said ferroelectric capacitor to simultaneously store the second binary digit of information in said ferroelectric capacitor.

15. A method of writing data into a ferroelectric capacitor having polarization states and a volatile storing mechanism and having a cell plate and a cell node that stores first logic states by altering polarization of the polarization states of said ferroelectric capacitor and that stores second logic states in the volatile storing mechanism that do not alter polarization of the polarization states of the ferroelectric capacitor, the steps of the method comprising writing one of the first logic states in the ferroelectric capacitor with a first voltage, setting the cell plate of the ferroelectric capacitor to ½ of the first voltage after the one of the first logic states is written in said ferroelectric capacitor, and applying to the cell node of said ferroelectric capacitor a voltage equal to ½ of the first voltage + or − X volts, where X volts is insufficient to disturb the one of the first logic states, for writing one of the second logic states in the volatile storing mechanism of the ferroelectric capacitor.

16. A method of writing data to a ferroelectric capacitor as set forth in claim 15, wherein said writing with a first voltage is with 5 volts and said applying a voltage equal to ½ of the first voltage + or − X volts is with X equal to 1 volt.

17. A method of reading binary digit information from a ferroelectric capacitor that store non-volatile logic states that change the polarization of said ferroelectric capacitor and simultaneously stores volatile logic states that do not change the polarization of said ferroelectric capacitor, the steps of the method comprising reading a stored volatile logic state from said ferroelectric capacitor and transferring it to a buffer cell, after transferring the stored volatile logic state to the buffer cell, reading/writing the non-volatile logic state stored in the ferroelectric capacitor, and re-writing the stored volatile logic state by transferring it from the buffer cell to the ferroelectric capacitor.

18. A semiconductor memory comprising means including a multi-level data storage device having a non-volatile mechanism with first and second states for storing a first binary digit of information and a volatile storing mechanism for simultaneously storing a second binary digit of information, a buffer cell, a bit line connected to said multi-level data storage device and to said buffer cell, sensing means connected to said bit line, and means coupled to said sensing means, said multi-level data storage device and said buffer cell for transferring said second binary digit of information from said multi-level data storage device to said buffer cell through said bit line without destroying the first binary digit of information remaining in said multi-level data storage device.

19. A semiconductor memory as set forth in claim 18 wherein said buffer cell is a one device memory cell including a storage capacitor and a transfer switch disposed between said capacitor and said bit line.

20. A semiconductor memory as set forth in claim 18 wherein said multi-level data storage device is a ferroelectric cell having a ferroelectric capacitor and a transfer switch disposed between said ferroelectric capacitor and said bit line.

* * * * *